United States Patent

Barkan

[15] 3,654,528

[45] Apr. 4, 1972

[54] COOLING SCHEME FOR A HIGH-CURRENT SEMICONDUCTOR DEVICE EMPLOYING ELECTROMAGNETICALLY-PUMPED LIQUID METAL FOR HEAT AND CURRENT TRANSFER

[72] Inventor: Philip Barkan, Media, Pa.

[73] Assignee: General Electric Company

[22] Filed: Aug. 3, 1970

[21] Appl. No.: 60,329

[52] U.S. Cl. .....................317/234 R, 317/234 A, 317/234 B, 317/234 P, 62/3, 165/80, 174/15

[51] Int. Cl. .........................................H01l 3/00, H01l 5/00

[58] Field of Search ...............317/234, 235 A, 235 B, 235 C, 317/235 D, 235 K, 100; 165/105, 106, 80; 62/3; 174/8, 15

[56] References Cited

UNITED STATES PATENTS

| | | | |
|---|---|---|---|
| 2,933,663 | 4/1960 | Connell | 317/234 |
| 3,361,195 | 1/1968 | Meyerhoff et al. | 317/234 X |
| 3,365,620 | 1/1968 | Butler et al. | 317/234 X |
| 3,400,543 | 9/1968 | Ross | 165/80 X |

FOREIGN PATENTS OR APPLICATIONS

| | | | |
|---|---|---|---|
| 914,034 | 4/1960 | Great Britain | 317/234 |

OTHER PUBLICATIONS

IBM Technical Disclosure Bulletin, Integrated Cooling and Contact Arrangement; by Chu et al., Vol. 12, No. 3, Aug. 1969, pp. 379.

IBM Technical Disclosure Bulletin; Electronic Equipment Cooling Using MHD Flow of Coolant; Hwang et al., Vol. 12, No. 3, Aug 1969, pages 386–387.

*Primary Examiner*—John W. Huckert
*Assistant Examiner*—Andrew J. James
*Attorney*—J. Wesley Haubner, William Freedman, Frank L. Neuhauser and Oscar B. Waddell

[57] ABSTRACT

A rectifier assembly comprises (a) a wafer primarily of semiconductor material having a pair of faces at opposite sides thereof and (b) a pair of liquid-metal cooling systems respectively located at opposite sides of the wafer. Each cooling system comprises a heat sink adjacent the wafer and a fluid circuit comprising a first passage extending through the heat sink and a second passage extending along a face of the wafer and feeding the first passage. Each cooling system further comprises, electrically in series with the wafer, an electromagnetic pump that is effective when energized by current through the rectifier assembly to force liquid metal coolant to flow around said fluid circuit, extracting heat from said wafer while flowing through said second passage and releasing heat to said heat sink when flowing through said first passage.

23 Claims, 8 Drawing Figures

Patented April 4, 1972

3,654,528

3 Sheets-Sheet 1

INVENTOR:
PHILIP BARKAN,
BY William Freedman
ATTORNEY

Patented April 4, 1972

3,654,528

3 Sheets-Sheet 2

INVENTOR:
PHILIP BARKAN,

BY William Freedman

ATTORNEY

INVENTOR:
PHILIP BARKAN,

BY William Freedman
ATTORNEY

COOLING SCHEME FOR A HIGH-CURRENT SEMICONDUCTOR DEVICE EMPLOYING ELECTROMAGNETICALLY-PUMPED LIQUID METAL FOR HEAT AND CURRENT TRANSFER

BACKGROUND

This invention relates to a high-current, solid-state, current-controlling device, such as a high-current rectifier assembly, that comprises a wafer of semiconductor material and, more particularly, relates to improved means for cooling the wafer during the passage of high currents through the assembly.

In the art of electric power conversion and switching, solid-state current-controlling components, known generally as semiconductor devices, are becoming increasingly popular. Such devices when properly made and applied are characterized by high reliability, compact size, long life, and low maintenance. Commonly used for their rectifying properties, these devices can be designed to withstand high reverse voltages with negligible leakage current and to conduct high forward current with only a minor voltage drop. Semiconductor rectifiers are presently available that are individually rated to conduct hundreds of amperes on an intermittent or continuous basis. But in some high-power applications such high-current devices may be transiently subjected for prolonged intervals to much higher currents due due to overloads or faults, in which event the power loss and consequent heat generation in the semiconductor wafer can abruptly rise to excessively high levels. As is well known, semiconductor material has definite temperature limits which must not be exceeded in order to avoid damage to the device. Where the overload duty is severe (e.g., the current passing through the rectifier for prolonged intervals of time, measured in seconds, is at magnitudes may times higher than normal), it has often been necessary to drastically derate the rectifier on a continuous current basis.

Various cooling schemes have been proposed for limiting the temperature rise of the semiconductor material during the high current intervals, but these cooling schemes have not been nearly as effective as might be desired for severe overload duty. In certain instances, this lack of effectiveness has required that several rectifiers, each individually capable of handling the rated continuous current, be connected in parallel so as to share the overload current and thus reduce the temperature rise of each rectifier during the overload.

One common type of cooling means is the type which employs one or more heat sinks of high thermal-conductivity metal against which the wafer assembly is clamped. In this type arrangement, moderate amounts of heat are transferred from the wafer assembly to the heat sinks by conduction. In certain instances, forced circulation of fluid coolant is used for cooling the heat sinks to increase the rate at which the heat sinks dissipate the heat extracted from the wafer assembly.

While this approach is relatively simple, it is not nearly as effective as might be desired for the type of circuit application referred to hereinabove where long-duration overload and fault currents may be encountered. Another disadvantage of this approach is that the wafer assembly must be clamped against the heat sink with relatively great force in order to limit the thermal and electrical resistance of the joint between the heat sink and the wafer assembly. This not only necessitates massive clamping means but also accentuates the problem of mismatched coefficients of thermal expansion between the semiconductor wafer and the metal heat sinks. The latter problem has heretofore been solved by using strong backing plates of tungsten or the like, but this backing disadvantageously imposes additional impedance to rapid heat transfer from the wafer assembly.

SUMMARY

An object of my invention is to provide highly effective means for cooling the wafer of semiconductor material which does not require the usual heavy clamping forces needed with prior clamped heat sink type arrangements.

Another object is to provide highly effective cooling means which does not require a thick mechanically strong backing for the wafer of semiconductor material.

Another object is to provide highly effective cooling means employing a liquid coolant in which there is a near-minimum of joints and solid barriers present between the semiconductor wafer and the coolant to impede heat transfer to the coolant.

Still another object is to extract heat from the semiconductor wafer not only by conduction but also by convection and, more specifically, by pumping liquid metal coolant through a cooling passage closely adjacent the wafer where it is in good heat transfer relationship with the wafer.

Still another object is to pump the liquid metal coolant through the cooling passage at a flow rate varying directly with the current through the wafer, thereby providing increased cooling action when most needed.

Still another object is to provide, for pumping and circulating the liquid metal coolant, a simple electro-responsive pump and fluid circuit that are both effectively integral with the rectifier assembly. This integral relationship obviates the need for an external circuit portion, for fittings to couple the external circuit portion to the rectifier assembly, and for means to provide electrical isolation between the pump and rectifier assembly.

Still another object is to utilize the liquid metal coolant for carrying electric current to or from the wafer of semiconductor material, thereby obviating the need for a massive solid conductor for this purpose between the coolant and the wafer.

BRIEF DESCRIPTION OF DRAWINGS

For a better understanding of the invention, reference may be had to the following description taken in conjunction with accompanying drawings wherein.

DETAILED DESCRIPTION OF PREFERRED EMBODIMENT

The Semiconductor Wafer 12 and its Mounting

Figure 1:
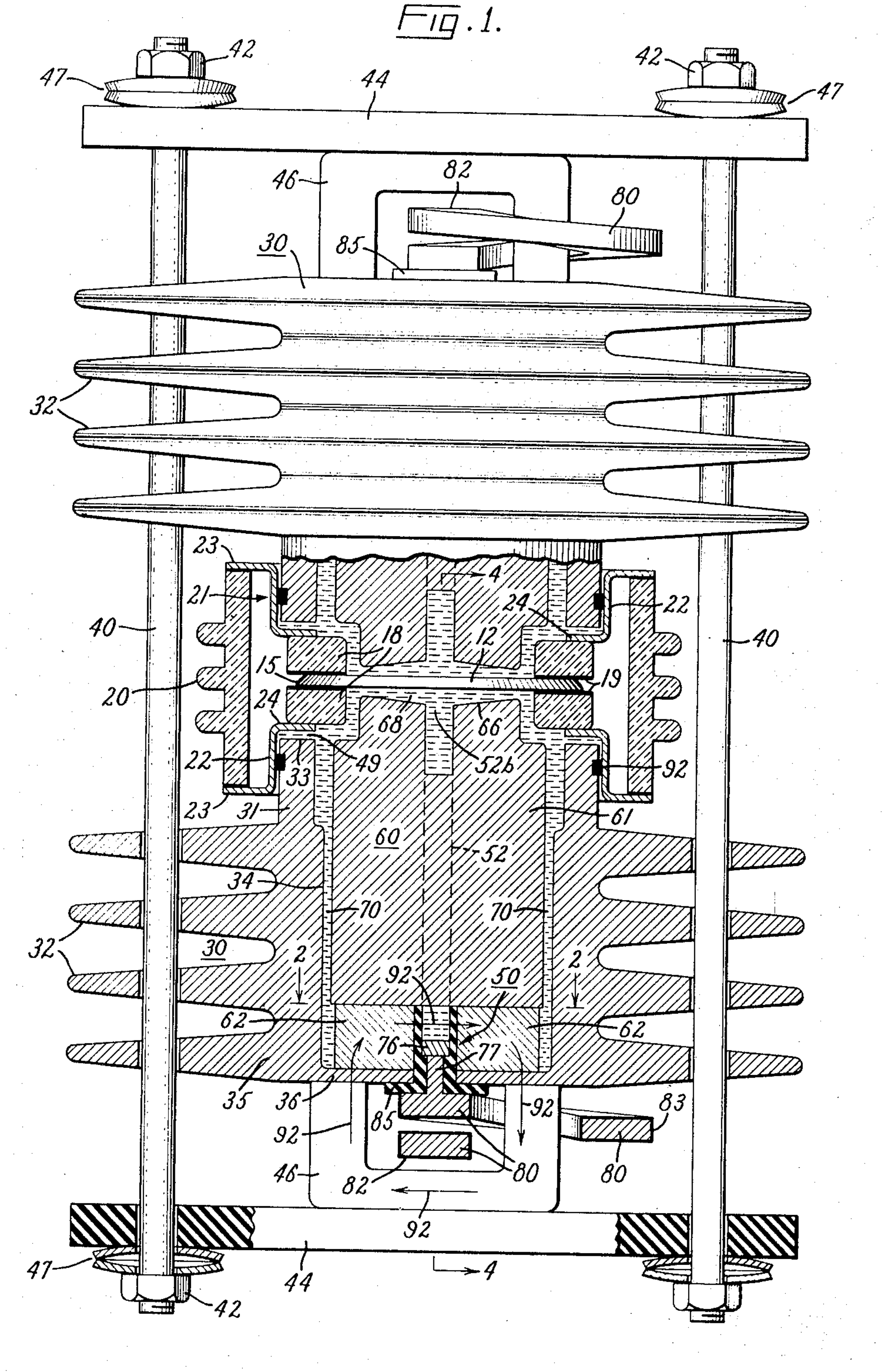
FIG. 1 is a section view of a rectifier assembly embodying one form of the invention.

Referring now to FIG. 1, there is shown a high current rectifier assembly comprising a wafer 12 of semiconductor material, such as silicon. This wafer has two opposed planar faces, which are preferably parallel to each other and are preferably coated with a thin protective coating of a metal, such as nickel, that is chemically inert in the illustrated environment. The specific composition of this coating is not a part of my present invention. The silicon wafer comprises at least two contiguous layers of different conductivity types (typically P and N) which form therebetween an internal broad area rectifying junction generally parallel to its faces. The wafer may function as a simple diode, in which case it will contain only a single rectifying (PN) junction; or it may function as a thyristor (i.e., a controlled rectifier), in which case it will contain additional PN junctions and a suitable gating means, all arranged in a conventional manner, the details of which are immaterial to the present invention. The edge of the silicon wafer is usually beveled along the outer periphery of the PN junction, and it is covered by a protective coating 15 of a suitable solid insulation, such as silicone rubber.

The semiconductor wafer 12 with its coated surfaces is occasionally referred to hereinafter as a "disk-like body." This term is intended to comprehend within its meaning an uncoated semiconductor wafer and also the combination of a semiconductor wafer and one or more substrates bonded to the semiconductor wafer. The term "disk-like body" is also intended to comprehend within its meaning bodies of the type described hereinabove with non-circular, as well as circular, peripheries.

For mounting the silicon wafer 12, two spaced-apart mounting rings 18 are provided. These rings are preferably of a ceramic material with substantially the same coefficient of thermal expansion as the silicon of the wafer 12. The silicon wafer is sandwiched between these rings, and the rings are clamped together under a modest amount of pressure, as will soon be described in greater detail. Each ring 18 has a coating 19 of silicone rubber on its surface that bears against the face of wafer 12 to provide a fluid-pressure seal between these parts 12 and 18.

Surrounding the ceramic rings 18 and wafer 12 is a cylindrical insulator 20 that forms a portion of an insulating housing for the wafer periphery. The wafer is supported on this insulator 20 by a pair of annular sheet-metal sealing members 21. Each of these sealing members comprises a cylindrical portion 22, a radially outwardly extending flange 23 at the outer end of the cylindrical portion 22, and a radially inwardly extending flange 24 at the inner end of the cylindrical portion. The outer flange 23 of each sealing member is hermetically bonded to an end surface of insulator 20, and the inner flange is hermetically bonded to one of the ceramic rings 18. The space 25 between rings 18 and insulating housing 20 is filled with an inert gas such as argon or nitrogen.

The Heat Sinks 30

The hermetically sealed assembly 12, 18, 21, 20 is mounted between a pair of substantially identical heat sinks 30, each comprising a generally tubular outer member 35 of a high conductivity metal, such as copper, and a core 60, also primarily of copper. Each of the outer heat sink members 35 has a cylindrical inner end portion 31 fitting within one of the sealing members 21 and having an end face 33 spaced a short distance from flange 24 of the sealing member. Each outer heat sink member 35 has a centrally located bore 34 extending longitudinally thereof and an outer end wall 36 extending across the bore at its outer end. On its outer periphery each heat sink member 35 has a plurality of heat-radiating fins 32 that serve in a conventional manner to transfer heat from the sink to the surrounding atmosphere.

For clamping together the two heat sinks 30 on opposite sides of the hermetically sealed assembly 12, 18, 20, 21, I provide a plurality of elongated studs 40. These studs 40 extend longitudinally of the rectifier assembly through suitable openings in the fins and have nuts 42 threaded onto their opposite ends. For transmitting clamping forces from the studs 40 to the heat sinks, a pair of clamping members 44 of electrical insulating material are provided at opposite ends of the rectifier assembly. Between each of these clamping members 44 and the adjacent heat sink 30 is an iron core 46, the main purpose of which will soon appear more clearly. Resilient washers 47, preferably of the Belleville type, are positioned between the nuts 42 and the clamping members 44. When the nuts are tightened, they compress washers 47 and apply axially directed clamping forces to the heat sinks 30 through the clamping members 44 and 46. These forces urge the heat sinks together, with the hermetically sealed assembly 12, 18, 20, 21 sandwiched therebetween, thus maintaining the entire assembly in the assembled relationship shown. For reasons which will soon appear more clearly, a small space 49 filled with liquid metal under pressure is left between each end face 33 and the adjacent flange 24.

During operation of the rectifier assembly, current flows through the assembly between a pair of terminals 82 at its respective upper and lower ends, passing through the centrally located wafer 12 in a downward direction when the upper terminal is positive and the wafer is in its non-blocking state. With conventional cooling such as described in the introductory portion of this specification, the wafer 12 can be made to handle the rated continuous current of many high power circuits without overheating. But difficulty can be encountered in handling the much greater heat inputs that are present during overloads and fault currents.

The Fluid Circuit of the Liquid Metal Coolant

As was pointed out hereinabove, an object of this invention is to provide highly effective cooling means capable of handling the increased heat inputs resulting under these overload and fault conditions and relying upon convection, as well as conduction, to extract heat from the wafer 12 during these intervals. In the illustrated embodiment, this cooling means comprises an electromagnetic pump <u>50</u> which operates in a manner soon to be described to force liquid metal coolant to flow upwardly through a fluid passage 52, then radially outward along the lower face of the wafer 12, and then downwardly through an annular passage 70 along the bore 34 of the tubular heat sink member 35.

Figure 2:
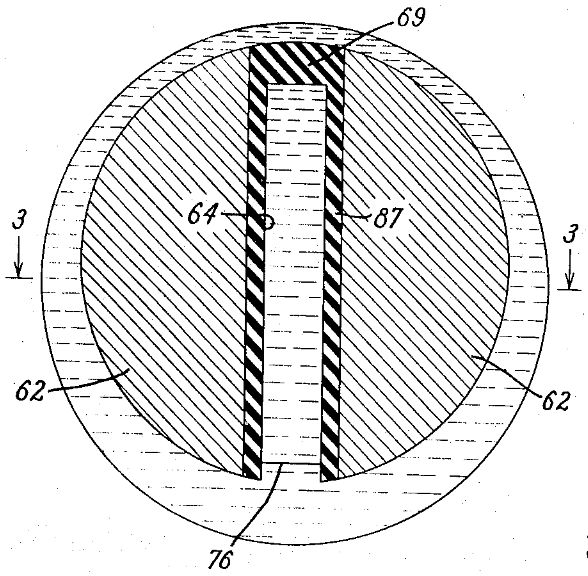
FIG. 2 is an enlarged sectional view along the line 2—2 of FIG. 1.

For defining the passageways along which the liquid metal coolant flows, a generally cylindrical heat sink core 60 is provided within the bore 34 of each tubular heat sink member 35 and is suitably attached to the outer end wall 36 thereof. Since the cores 60 are substantially identical, only the lower core will be described in detail. This lower core 60 comprises a main body portion 61 of a highly conductive material such as copper and a pair of iron pole pieces 62 suitably attached to the lower end of main body portion 61. The pole pieces 62 are each of a generally semicircular cross-section as viewed in FIG. 2 and are spaced apart by a diametrically extending channel 64 extending across the bottom face of the core 60.

Figure 4:
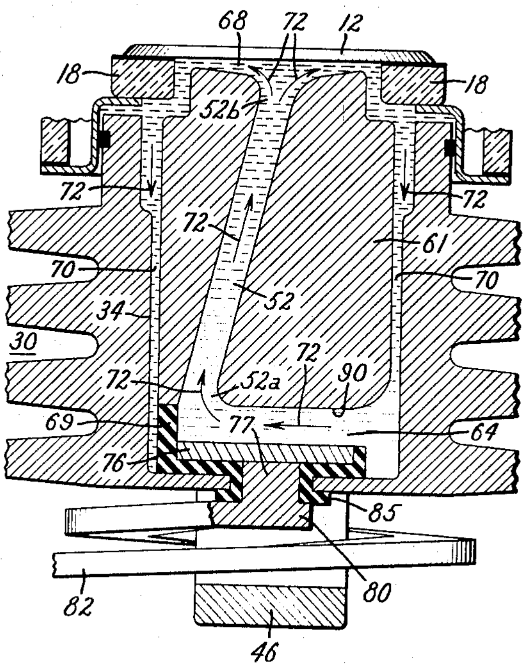
FIG. 4 is a sectional view along the line 4—4 of FIG. 1.

The lower core 60 has a slightly dished upper face 66 that is spaced a short distance from wafer 12 to leave a passageway 68 between the upper face 66 and the lower surface of wafer 12. As seen in FIG. 4, the passageway 68 above the core 60 and the channel 64 beneath the core are interconnected by a feed passage 52, which extends from an inlet 52*a* at one end of channel 64 to an outlet 52*b* at a central location on the upper face 66 of the core. The outer periphery of core 60 is spaced radially inwardly from bore 34 to leave an annular passageway 70 between the core periphery and bore 34. Referring to FIG. 4, at the left-hand end of channel 64 there is a plug 69 of electrical insulating material that blocks the coolant flowing to the left through channel 64 from directly entering annular passage 70 through the left-hand end of the channel.

As illustrated in FIG. 4, the electromagnetic pump <u>50</u>, when energized, forces the liquid metal coolant to circulate via the path indicated by the arrows 72. More specifically, the electromagnetic pump forces the coolant to flow to the left through the lower channel 64, then upwardly through feed passage 52 through outlet 52*b*, radially outwardly through passageway 68, and then downwardly through annular passage 70 and back to the right hand end of channel 64.

In passing radially outwardly along the lower face of wafer 12, the liquid metal coolant extracts heat from the wafer. In passing downwardly through annular passage 70, the heated coolant releases heat to the tubular heat sink member 35 through the surface of bore 34. After having thus released heat extracted from wafer 12, relatively cool coolant enters channel 64 and is pumped through the channel and feed passage 52 to again become available to extract heat from wafer 12.

In the region surrounding the upper portion 61 of core 60, the annular passage 70 has a substantially uniform radial dimension at any given axial location. This dimensional uniformity helps to distribute the axially directed flow uniformly about the periphery of the core, thus distributing the heat removal duty of the tubular heat sink member 35 substantially uniformly about the circumference of its bore 34. Around the circular periphery of the two pole pieces 62, however, the passage 70 has a larger radial dimension adjacent the entrance to channel 64 than at the opposite end of the channel. This enlargement of the flow passage adjacent the channel entrance allows the fluid that had flowed circumferentially around the core periphery to enter the channel 64 without an undue pressure drop in this region.

Although there are a number of different types of liquid metals that are suitable for use as coolants in my cooling system, I prefer to use a eutectic alloy of sodium and potassium, commonly referred to as NaK-77. This material is an excellent thermal conductor, an excellent electrical conductor, has a low density, and remains in the liquid state over a wide range of temperature, i.e., from −12° C. to 1,000° C. Another liquid metal that can be used is mercury, though it has much greater density. Still another are mixtures of sodium, potassium and cesium, which have exceptionally low freezing temperatures.

Good electrical conductivity of the coolant is important, among other reasons, because the electric current flowing downwardly through the wafer 12 must flow vertically across the liquid metal in the two cooling passages 68 at opposite sides of the wafer, as will soon appear more clearly. The good electrical conductivity of the liquid metal limits the heating produced by the current flowing through the liquid metal in passages 68. Good thermal conductivity is important because the liquid metal is relied upon to extract heat from the wafer as it passes radially outwardly a long each face of the wafer.

The Electromagnetic Pump 50

The usual electromagnetic pump comprises a conduit containing a conductive liquid, means (which may be either a permanent magnet or an electromagnet) for establishing a magnetic field transversely of the conduit through the conductive liquid, and means for conducting current through the liquid in a direction perpendicular to the magnetic field. The current and the magnetic flux interact in a known manner to develop a pressure gradient in the conductive liquid which forces the liquid along the conduit in a direction perpendicular to the field and direction of the current.

My electromagnetic pump 50 operates in generally this manner and comprises current-directing means for forcing most of the electrical current flowing through the rectifier assembly to follow a path that extends vertically through the conductive coolant in channel 64. This current-directing means comprises an electrode 76 that is positioned in the channel 64 and is of an elongated bar-form with its longitudinal dimension extending axially of the channel. Integral with electrode 76 is a conductive stud 77 that extends through the bottom wall 36 of the lower heat sink member 35. A coil 80 for generating the magnetic flux used in the pump is joined to the conductive stud 77 at its lowermost end. This coil 80 encircles one leg of the U-shaped iron core 46 and has an outer end 82 that serves as one terminal of the rectifier assembly. The illustrated coil 80 is formed of a rectangular cross-section conductor that is coated with electrical insulation 83.

Figure 3:
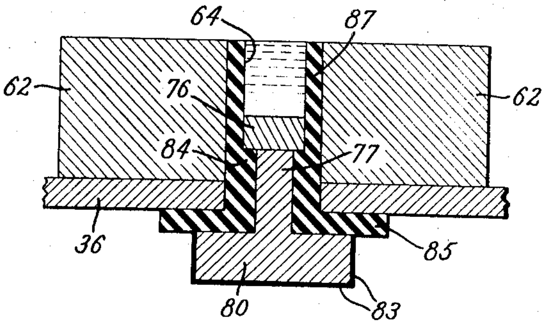
FIG. 3 is a sectional view along the line 3—3 of FIG. 2.

Substantially all of the current that flows downwardly through the rectifier assembly can enter coil 80 only through electrode 76 and stud 77 since the coil 80 is otherwise electrically insulated from the rectifier assembly. In this respect, note in FIGS. 1, 3, and 4 that the periphery of stud 77 is completely surrounded by electrical insulation 84 and that a portion 85 of the insulation is disposed between the upper surface of coil 80 and lower end wall 36. Such insulation allows current to enter the stud 77 and coil 80 only through electrode 76. Additional electrical insulation allows current to enter electrode 76, for the most part, only via a path that extends vertically across the channel 64 through the conductive liquid therein. This additional insulation comprises portions 87, which line the vertical walls of channel 64, and a portion of 84 which extends beneath the electrode 76. The top wall 90 of channel 64 is free of electrical insulation and thus nearly all of the current enters the conductive liquid only through the top wall 90. This top wall portion 90 may be considered as one of the electrodes of the pump 50. The current entering through top wall 90, for the most part, flows downwardly through the conductive liquid in channel 64, exiting through electrode 76. Preferably, electrode 76 has as insulating coating on its right hand end (FIG. 4) to prevent current from entering the electrode through this end and bypassing the above-described vertical path through channel 64.

As mentioned hereinabove, the magnetic field for the electromagnetic pump 50 is developed by current flowing through coil 80. This current develops magnetic flux which follows a path, indicated by arrows 92 in FIG. 1, through a magnetic circuit comprising the U-shaped magnetic core 46, the iron pole pieces 62, and the gap between the pole pieces 62 formed by channel 64. This flux follows a path across channel 64 which extends substantially horizontally. Since, as previously described, the electric current through the conductive liquid in channel 64 follows a vertically extending path, the flux and the current are able to interact to force the conductive liquid in channel 64 longitudinally thereof toward the left in FIG. 4. It is noted that no current flows through the core 46 inasmuch as this core is mounted on an insulating member 44 and is locally insulated from coil 80.

The flow rate developed by pump 50 varies directly with the magnitude of the current through the rectifier assembly. For low currents, this flow rate is relatively low; but when the current increases, the flow rate increases correspondingly. One important advantage of an electromagnetic pump is that it is capable of responding very rapidly to a rise in current. Within a few milliseconds, the electromagnetic pump can accelerate the liquid metal coolant to the required high flow rate, thus making immediately available the increased cooling effect resulting from the higher flow rate. This rapid response is especially important in limiting the temperature rise of the wafer during the early stages of an overload or similar condition that produces a rapid rise in current through the rectifier assembly.

Although I prefer to use an electromagnet for developing the magnetic field for the pump 50, it is to be understood that a permanent magnet may instead be used for many applications. Even though a permanent magnet is used, such a pump is still referred to as an electromagnetic pump in view of the interaction present between electric current and magnetic field.

Pressurizing the Liquid Coolant and Distributing Forces Developed by the Pumps 50

For preventing cavitation in the liquid cooling system in response to a sudden increase in pumping action, I utilize the clamping bolts 40 to maintain a positive pressure on the liquid metal coolant. In order to provide for such pressurization, before the nuts 42 are tightened during initial assembly, I suitably evacuated all of the passages in the fluid circuit 64, 52, 68, 70 to remove the air therein and then completely fill these passages with the liquid metal coolant. At this time the end face 33 of the heat sink member 35 is spaced a short distance from flange 24, and the space therebetween is therefore filled with liquid coolant. When the nuts 42 is tightened, liquid in this space is forced into the fluid circuit proper, thereby pressurizing the coolant. In a preferred form of the invention, a small space 49 remains between end face 33 and flange 24 after the nuts 42 have been tightened to their final position. For preventing liquid from being expelled from the fluid circuit when nuts 42 are tightened and for otherwise maintaining the fluid circuit sealed, an O-ring seal 92 is provided between the outer surface of tubular heat sink portion 31 and the tubular portion 22 of sealing member 21. This seal 92 is preferably carried in an annular groove in heat sink portion 31 and serves to prevent any leakage between parts 31 and 22.

Another important function served by the clamping studs 40 is to substantially equalize the fluid pressures developed in passages 68 on opposite sides of the wafer 12. These pressures tend to be substantially equal since they are respectively dependent upon pumps 50 of substantially identical construction that are energized by the same current flowing through the rectifier assembly and further since the fluid circuits in the two cooling systems are substantially identical. But if pressure inequality should develop, forces would be transmitted through the studs 40 to cancel out these equalities. In this respect, the liquid in the particular passage 68 that has the higher pressure would force its associated core 60 and heat sink portion 35 slightly further from the wafer and against its associated clamping member 44. The resulting force on clamping member 44 would be transmitted through the washers 47 and studs 40 to the other clamping member 44, thereby urging the other heat sink portion 35 and core 60 toward the wafer. This would increase the pressure in the other passage 68 until the pressure in the two passages 68 had substantially equalized. It will be seen that the spaces 49 provide a floating relationship of the heat sinks with respect to the wafer that allows the studs to perform the above-described pressure and force-equalization on opposite sides of the wafer 12. This paragraph assumes above that the wafer assembly 12, 18 is the stationary part of the overall assembly. Of course, if one of the heat sinks is assumed to be the stationary component, then the wafer assembly would move slightly in response to pressure inequalities.

The resilient washers 47 should have a relatively high spring gradient in order to inhibit their yielding so readily as to interfere with the pressure build-up accompanying normal pump operation. This gradient, however, should not be so high as to produce an undue pressure build-up when the liquid metal expands in response to thermal expansion effects.

As was pointed out hereinabove, prior clamped heat sink arrangements have utilized very high clamping pressures for forcing the heat sinks against the wafer assembly so as to reduce the thermal and electrical impedances of the joints therebetween. The presence of these high pressures has necessitated providing a mechanically strong backing for the wafer to protect the wafer against damage from the forces resulting from mismatched thermal coefficients of expansion between the semiconductor wafer and the metal heat sinks while under such pressures. Typical clamping pressures previously used have been between 1,000 and 3,000 p.s.i. In contrast to these high pressures, I typically use clamping pressure of only about 40 p.s.i. I am able to obviate the need for the previously used high pressures since I do not rely upon such high pressures to force solid parts together to reduce thermal and electrical impedance. In my assembly, liquid metal is present at all of the key joints, and only a small amount of pressure is sufficient to assure low thermal and electrical impedance. The absence of the previously used high pressures is an important factor in enabling me to dispense with the thick metal backing heretofore present.

General Discussion

As stated hereinabove, conventional rectifier assemblies usually comprise thick plates or backings of metal joined to or clamped against the wafer or wafer assembly. The heat extracted from the wafer must flow through these plates and joints or interfaces before reaching a heat-dissipating region, and this detracts from cooling effectiveness inasmuch as these plates and joints impose a relatively high impedance to heat flow. In contrast, my arrangement is free of thick plates and joints between the wafer and the liquid metal coolant, and heat can transfer directly to the coolant without encountering the impedance presented by such plates and joints. Since the protective coating on the wafer 12 of FIG. 1 is far less than one mil in thickness, it will be apparent that in the embodiment of FIG. 1 the liquid flowing through passage 68 passes within a few mils of the semiconductor material itself.

It may be desirable in some applications of my invention to use a metal plate as a mechanical back-up for the semiconductor material in order to provide added protection against damage from mechanical forces and from improper handling. Such a plate can be kept relatively thin, however, in view of the much lower clamping forces involved in my assembly than in typical prior assemblies and in view of other considerations pointed out hereinafter. The thinness of such plate desirably limits its impedance to heat transfer. Moreover, the presence of liquid metal coolant flowing at high velocity immediately adjacent the plate still contributes to improved cooling, even if not as effective as without the plate. Reducing the plate thickness also materially reduces its cost.

Most prior cooling arrangements have relied almost entirely upon conduction for extracting heat from the wafer and transferring it to a heat sink for dissipation, but my cooling arrangement relies not only upon conduction but to a large extent upon convection, carrying the heat from the immediate region of the wafer by the liquid metal flowing at high velocity along its broad surfaces. Convection utilizing a liquid metal coolant is a much more effective way of extracting heat than simple conduction. It is to be noted that my coolant remains in the liquid state at all times during operation of my assembly.

Although reliance is placed principally upon convection for cooling the wafer 12, it should be noted that conduction cooling is still available in the illustrated arrangement. In this regard, the liquid metal coolant, having excellent thermal conductivity, can transfer heat by conduction from the wafer to the heat sink 30 even when stationary or moving at low velocity. An important function served by such conduction is that of providing cooling action during the very short interval between the onset of high current and the point at which the pump has accelerated the coolant to the desired high flow rate. The coolness of the liquid and heat sink at the start of this interval aids the conduction process. Well before conduction cooling can lose its effectiveness, the flow is up to a sufficient level to have effective convection cooling.

For increasing the effectiveness of the cooling, the flow rate adjacent the wafer surface is increased to high values during periods of high current. This is done, first of all, by relying upon an electromagnetic pump that forces flow to take place at a rate varying directly with current, as has been described hereinabove, and, secondly, by keeping the depth of the cooling passage 68 adjacent the wafer quite small, thus causing the velocity of the liquid passing radially outward therethrough to be quite high. It is to be noted that the liquid metal coolant is in contact with substantially all the surface area of the wafer through which current passes since there is no appreciable current through the wafer areas in contact with the silicone rubber coating 19 on mounting rings 18.

In the preferred form of the invention illustrated, a generally uniform temperature of the silicon wafer is maintained across its face portion that is exposed to the liquid metal coolant. This is accomplished by making the velocity of the coolant higher in its radially outer regions than in its central regions. For controlling the velocity in this manner, the passage 68 is made much deeper in its central region than at its radially outer region, e.g., 40 mils in the central region as compared to 4 mils at the outer edge. This difference in depth results from the dished configuration of the upper surface 66 of core 60.

It is to be noted that the above-described cooling means is highly compact and effectively integral with the rectifier assembly. Since the entire fluid circuit 64, 52, 68, 70 and major portions of the pump 50 are disposed largely within the confines of heat sink 30, there is little structure which must be provided exteriorly of the heat sink to accommodate the liquid metal cooling means. In prior rectifier assemblies of corresponding continuous current rating employing conventional metal-block heat sinks on each side of the wafer, heat sinks even larger in volume than each of my heat sinks 30 are needed to maintain the wafer temperature within acceptable limits. Moreover, such prior assemblies have not been able to handle overcurrent-produced heat inputs nearly as high as my rectifier assembly.

One reason that I am able to limit the volume of my cooling arrangement is that my liquid metal cooling means, with its superior ability to rapidly transport heat, provides a more uniformly distributed temperature rise of the metal mass in a given short time interval when the heat input is rising, as when an overload occurs. With metal-block cooling, the heat generated at the wafer must travel by conduction through a long solid path, and thus for a relatively long period the more remote portions of the metal mass are not being efficiently used.

A factor that enables me to reduce the surface area needed for the cooling fins is that during continuous currents I can operate the fins and heat sink at a higher temperature than is possible with metal-block cooling in view of the ability of my cooling arrangement to more quickly and effectively respond to overcurrents with increased cooling action. With metal-block cooling, a lower continuous current temperature of the heat sink must be maintained to assure that sufficient cooling capacity is available when overcurrents occur.

The fact that the fluid circuit 64, 52, 68, 70 is effectively integral with the heat sink structure is advantageous in eliminating the need for an external fluid circuit portion and special fittings for coupling the external circuit portion to the rectifier assembly. Also since the components of pump 50 are either integral with or immediately adjacent and at the same potential as the heat sink structure, there is no need for any electrical isolation between these parts.

Still another advantage of my assembly as compared to prior assemblies of the type comprising plates bonded or clamped to the wafer and metal block heat sinks clamped or bonded to the wafer unit is that the construction of my assembly allows many of the grinding and lapping steps used in making the prior assemblies to be eliminated. In the prior assemblies, it has been necessary that the surfaces on the plates and wafer be precisely planar or otherwise configured in order to assure good broad-area contact or a good broad-area joint with continuous surfaces. Expensive grinding and lapping have been relied upon to provide the desired precise surface configuration. Such broad area contacts and joints have been needed to minimize thermal and electrical resistances. My assembly, however, employs a yielding medium in the form of a conductive liquid for contacting the wafer and for transferring heat and electric current to and from the wafer and thus needs fewer of such precisely configured surfaces.

In those wafer assemblies that have a backing plate bonded thereto, there is a tendency of the wafer assembly to bow slightly during its manufacture, as pointed out in U.S. Pat. No. 3,457,472-Mulski, assigned to the assignee of the present invention. One reason for making the backing plate thick has been to minimize this bowing effect. My rectifier assembly can tolerate much more of this bowing than conventional assemblies since my wafer assembly, with its liquid contacts at one or more faces, does not require the precisely planar parallel surfaces needed for broad area contact between solid members, as in prior rectifier assemblies. This greater tolerance for bowing is an additional factor enabling me to reduce the thickness of any backing plate that might be present.

Modified Form

Figure 5:
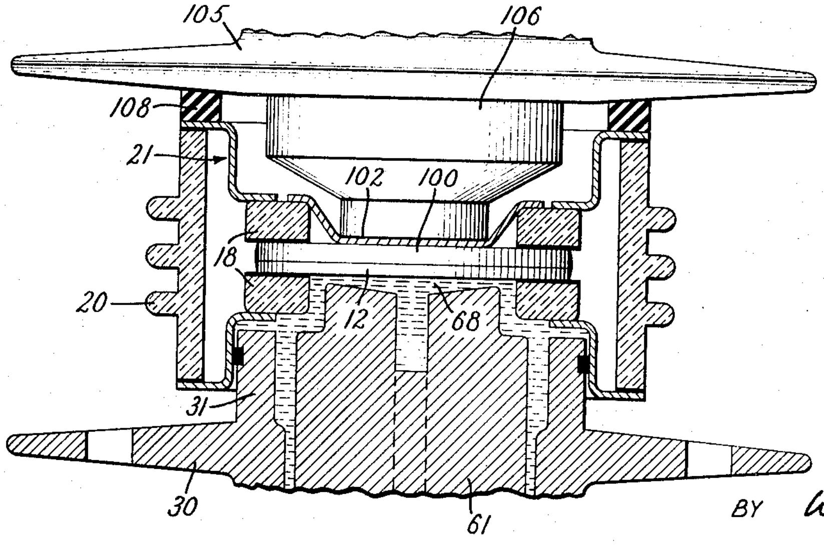
FIG. 5 is a sectional view of a modified form of the invention.

Although I prefer to employ a separate liquid-metal cooling system for each side of the wafer, it is to be understood that where the cooling requirements are less demanding, liquid-metal cooling can be used on only a single side of the wafer. The other side of the wafer can be cooled by any suitable conventional cooling means, e.g., a copper-block heat sink clamped thereto. Such a modified arrangement is shown in FIG. 5, where the same reference numerals as appeared in FIG. 1 have been used to designate parts corresponding to those present in FIG. 1. In FIG. 5 the silicon wafer is shown at 12 bonded to a mechanically strong substrate or backing 100 preferably of tungsten having a suitable facing on its top surface of gold-nickel or the like. A thin sheet metal closure member 102 having some yieldability is bonded to the upper ceramic ring 12 and has a flat bottom in contact with the top surface of backing 100. This closure member 102 is of a ductile highly conductive metal such as silver or copper.

A conventional copper-block heat sink 105 is mounted atop the insulator 20 and has a post portion 106 projecting into the cup-shaped cavity formed by the cylindrical sealing member 21. A yieldable annular washer 108 is located between a portion of the heat sink 105 and the upper portion of the insulator 20. The heat sink is forced downwardly with respect to the insulator 20 by suitable clamping means (not shown) and this forces the post portion 106 and the bottom of closure member 102 downwardly against the tungsten backing 100 to provide high-pressure contact between these parts. The tungsten backing 100, being mechanically strong, can withstand this clamping pressure without damage or distortion.

The above-described parts 102, 106 and 105 on the upper face of the wafer assembly serve in a known manner to conduct heat upwardly away from the wafer assembly for dissipation by the heat sink 105. The details of these upper components form no part of the present invention and have been simplified to facilitate an understanding of the present invention.

The lower side of wafer 12 is cooled by liquid metal cooling means corresponding to that shown in FIG. 1, with corresponding reference numerals being used in these two figures to designate like parts.

Additional Modified Forms

Though not essential, it is desirable that the dimensions of cooling passages 68 remain essentially constant under all operating conditions, thus insuring that there will be no changes in velocity of the coolant through these passages 68 as a result of dimensional changes. In the embodiment shown in FIG. 1, some change in these dimensions will occur if a heat sink, 35, 60 moves with respect to the wafer 12 in response to pressure inequalities in the two passages 68 or in response to thermally induced expansion or contraction of the liquid coolant. In the modified form shown in FIG. 6, I hold the dimensions of passages 68 essentially constant by allowing for some relative motion between the two major components 35 and 60 of the heat sink and by clamping the core component 60 to the mounting rings 18.

For effecting such clamping, I provide the core 60 on its outer periphery with a plurality of circumferentially spaced teeth 161 (FIGS. 6 and 8) which bear against the mounting ring 18. The two cores 60 are clamped together by two rigid tie rods 162 located exteriorly of the heat sink 30 and acting on two clamping bars 164 of insulating material at opposite ends of the assembly bearing against the U-shaped magnetic structures 46. When nuts 165 on the tie rods are tightened, they force the cores 60 toward each other, causing the teeth 161 to bear against the outer sides of mounting rings 18, thereby clamping the rings 18 and the wafer 12 between the cores 60.

Figures 6, 7, 8:
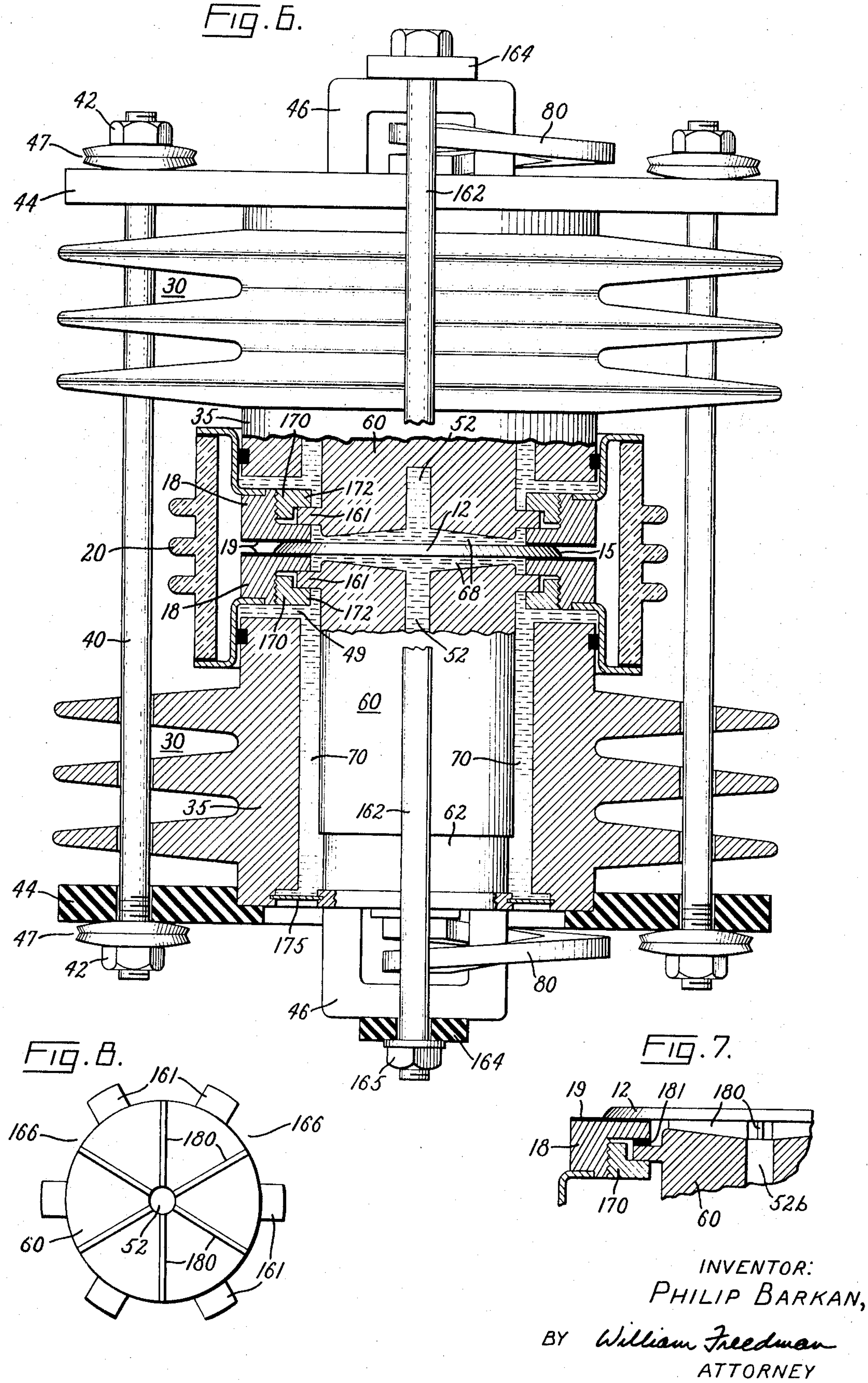
FIG. 6 is a side elevational view, partly in section, of another modified form of the invention.
FIG. 7 is a sectional view, similar to a portion of FIG. 6, illustrating another modified form of the invention.
FIG. 8 is a plan view of core 60 of FIG. 7.

To facilitate assembly of the structure of FIG. 6, each of the upper and lower subassemblies is provided with a clamping ring 170 having an internal shoulder 172 bearing against the back side of the teeth 161. This clamping ring 170 has external threads thereon that mesh with internal threads provided in the mounting ring 18. When tightened, the clamping ring 170 holds the teeth 161 against the mounting ring 18.

The mounting rings 18 of FIG. 6 are preferably of a suitable metal, such as tungsten, coated with silicone rubber at 19.

In the modification of FIG. 6, the outer tubular member 35 of each heat sink 30 is capable of moving axially relative to its associated core 60. Such relative movement is permitted by reason of a suitable flexible metal diaphragm 175 connected between these two members 35 and 60. This relative movement allows the liquid metal coolant to expand and contract in response to temperature changes without changing the dimensions of passages 68. For example, expansion of the coolant forces tubular member 35 in a direction away from mounting ring 18, thereby increasing slightly the clearance space 49. But despite this movement of member 35, core 60 remains clamped to mounting ring 18 to maintain the dimensions of passage 68 unchanged.

For biasing each of the outer heat sink members 35 toward the mounting ring 18 adjacent its inner end, a plurality of tie rods 40 having Belleville washers 47 mounted thereon are provided. At each end of the tie rod, these resilient washers 47 are positioned between a nut 42 on the tie rod and a clamping ring 44 bearing against the outer tubular member 35. These resilient washers and atmospheric pressure acting on diaphragm 175 maintain the liquid metal coolant under pressure at all times.

In the embodiment of FIG. 6, liquid metal flows around the fluid circuit in essentially the same manner as in FIGS. 1–4. Communication between the passages 68 and 70 is afforded by the spaces 166 between the teeth 161, as indicated in FIG. 8.

Another advantage of the arrangement of FIG. 6 is that it lends itself to the inclusion of reinforcing means for mechanically backing up the wafer 12. Referring to FIGS. 7 and 8, such reinforcing means comprises a plurality of reinforcing projections or ribs 180 on the face of each core 60 adjacent the wafer 12. The ribs 180 are shown as radially extending but may be of other suitable configurations. The edges of these ribs either bear against the face of the wafer or are disposed immediately adjacent the wafer face so that any significant deflection of the wafer brings the face into contact with the ribs. In those designs where the wafer face normally engages the ribs 180, I prefer to include a resilient washer 181 between the teeth 161 and the mounting ring 18 so that most of the clamping force that holds the cores 60 together is still transmitted to the mounting rings 18. The reinforcing ribs 180 on the two cores should be in substantial alignment, or at least partially in alignment, in order to reduce bending loads on the wafer in regions between the ribs.

Although the presence of reinforcing ribs 180 reduces the face area of the wafer that is in contact with the liquid metal coolant, this reduction is relatively small and most of the face area through which electric current passes is still in contact with the liquid metal coolant. Despite the presence of ribs 180, the space between the core and the wafer can still be considered as a passageway (68).

While I have shown and described particular embodiments of my invention, it will be obvious to those skilled in the art that various changes and modifications may be made without departing from my invention in its broader aspects; and I, therefore, intend herein to cover all such changes and modifications as fall within the true spirit and scope of my invention.

What I claim as new and desire to secure by Letters Patent of the United States is:

1. A solid state current-controlling assembly comprising:
   a. a disk-like body at least partially of semiconductor material having at least one internal rectifying junction and having a pair of faces at opposite sides thereof,
   b. a heat sink comprising a generally tubular portion of metal of high thermal conductivity having a bore across which said disk-like body is disposed,
   c. said heat sink further comprising a metal core disposed within said bore and having a periphery spaced from said bore along at least a portion of said core periphery to define a first passageway between said bore and said core periphery extending longitudinally of said core,
   d. said core having a face at one longitudinal end, at least a portion of which is spaced from said disk-like body to provide a second passageway between said core face and a face of said disk-like body,
   e. means for interconnecting said first and second passageways and providing a fluid circuit in which said first and second passageways are connected in series,
   f. liquid metal filling said fluid circuit and serving to transfer electric current between said disk-like body and said heat sink,
   g. electromagnetic pumping means in said fluid circuit for forcing liquid metal around said fluid circuit in a direction to produce flow successively through said second passageway, said first passageway, said pumping means, and then back to said second passageway, thereby causing heat to be transferred from said disk-like body to said liquid metal and thereafter from said liquid metal to said heat sink,
   h. said electromagnetic pumping means comprising a pair of spaced-apart electrodes on opposite sides of liquid metal in said fluid circuit between which current flows across said liquid metal when said pumping means is in operation,
   i. and means for electrically connecting said spaced-apart electrodes in series circuit with said body of semiconductor material.

2. A current-controlling assembly as defined in claim 1 in which:
   a. said heat sink, said fluid circuit, said liquid metal, and said electromagnetic means constitute a first cooling system disposed at one side of said disk-like body for producing a cooling flow of liquid metal along one face of said disk-like body,
   b. there is provided a second cooling system having substantially the same construction as defined in claim 1 for said first cooling system, and
   c. said second cooling system is located at the opposite side of said disk-like body from said first cooling system and is operable to provide a cooling flow of liquid metal along the other face of said disk-like body.

3. The current-controlling assembly of claim 1 in which:
   a. said pumping means comprises a channel extending generally diametrically of said core at a location axially spaced from said core face,
   b. means is provided to define an entrance to said channel at one end of the channel for liquid metal that has passed through said first passageway,
   c. a third passageway is provided at the opposite end of said channel for conducting liquid metal through said core to said second passageway, and
   d. means is provided for blocking the flow of liquid metal from said channel into said first passageway except via said third passageway.

4. The assembly of claim 3 in combination with a magnet having spaced-apart pole pieces on opposite sides of said channel for directing magnetic flux across said channel transversely of the electric current flowing through the liquid metal therein.

5. A solid-state current-controlling assembly comprising:
   a. a disk-like body at least partially of semiconductor material having at least one internal rectifying junction and having a pair of faces at opposite sides thereof,
   b. a heat sink primarily of highly conductive metal having a portion closely adjacent said disk-like body and provided with a first passageway through which liquid may pass and release heat to said metal,
   c. means defining a second passageway extending along one face of said disk-like body and having an outlet communicating with said first passageway,
   d. means providing a fluid circuit in which said first and second passageways are connected in series,
   e. liquid metal filling said fluid circuit and serving to transfer electric current between said disk-like body and said heat sink,
   f. electromagnetic pumping means in said fluid circuit for forcing liquid metal around said fluid circuit in a direction to produce flow successively through said second passageway, said first passageway, said pumping means, and then back to said second passageway, thereby causing heat to be transferred from said disk-like body to said liquid metal and thereafter from said liquid metal to said heat sink, g. said electromagnetic pumping means comprising a pair of spaced-apart electrodes on opposite sides of liquid metal in said fluid circuit between which current flows across said liquid metal when said pumping means is in operation, and h. means for electrically connecting said electrodes in series with said body of semiconductor material.

6. A current-controlling assembly as defined in claim 5 in which:

a. said heat sink, said fluid circuit, said liquid metal and said electromagnetic pumping means constitute a first cooling system disposed at one side of said disk-like body for producing a cooling flow of liquid metal along one face of said disk-like body, b. there is provided a second cooling system having substantially the same construction as defined in claim 5 for said first cooling system, and c. said second cooling system is located at the opposite side of said disk-like body from said first cooling system and is operable to provide a cooling flow of liquid metal along the other face of said disk-like body.

7. A current-controlling assembly as defined in claim 5 in which said second passageway is of such shape that liquid metal flowing therethrough flows along the face of said disk-like body portion over a major portion of the face area through which current passes.

8. A current-controlling assembly as defined in claim 5 in which electrical current passing through said assembly follows a path extending in series through said semiconductor body and the liquid metal in said second passageway.

9. An assembly as defined in claim 5 in which electric current passing through said assembly follows a path extending in series through said semiconductor body and the liquid metal in said second passageway, and the spaced-apart electrode of said electromagnetic pumping means.

10. An assembly as defined in claim 5 in which said second passageway conducts liquid metal radially outwardly from a location centrally of said disk-like body to a location near the outer periphery of the area of said disk-like body through which electrical current passes.

11. The current-controlling assembly of claim 10 in which said second passageway has a depth, measured axially of said disk-like body, that decreases from said central location toward said outer peripheral location.

12. A current-controlling assembly as defined in claim 5 in which said fluid circuit comprises a third passageway extending from said pumping means to said second passageway, the outlet of said third passageway being located centrally of said disk-like body, the outlet of said second passageway extending along a generally circular path located near the outer periphery of the area of said disk-like body through which electric current passes.

13. A current-controlling assembly as defined in claim 5 in which said liquid metal in said second passageway passes along the face of said disk-like body within a few mils of the semiconductor material in said disk-like body.

14. A current-controlling assembly as defined in claim 5 in which said pumping means comprises a magnet for pro.iding a magnetic field having its flux lines extending across the portion of said fluid circuit traversed by electric current passing between said spaced-apart electrodes in a direction transverse to the current path.

15. A current-controlling assembly as defined in claim 5 in which said pumping means comprises an electromagnet for providing a magnetic field having its flux lines extending across the portion of said fluid circuit traversed by electric current passing between said spaced-apart electrodes in a direction transverse to the current path, said electromagnet comprising a coil electrically connected in series with said body of semiconductor material for developing said magnetic field.

16. A current-controlling assembly as defined in claim 6 in combination with means for substantially equalizing the force developed on opposite sides of said disk-like body by the pumping means of said two cooling systems.

17. A current-controlling assembly as defined in claim 16 in which said equalizing means comprises force-transmitting structure extending between said two cooling systems for transmitting force developed at one side of said disk-like body to the liquid metal in the cooling system at the other side of said disk-like body in a direction to increase the pressure of the liquid in the cooling system at said other side in response to a pressure increase at said one side.

18. The current-controlling assembly of claim 16 in which said equalizing means comprises:

a. means for mounting at least a portion of each of said heat sinks for movement relative to said disk-like body in such a manner that an increase of pressure in one cooling system tends to increase the volume of said one cooling system, b. and force-transmitting means for mechanically interconnecting said heat sinks portions so that an increase in the volume of one cooling system tends to decrease the volume of the other cooling system.

19. The current-controlling assembly of claim 1 in which:

a. said core is effectively fixed to said disk-like body, thereby maintaining the dimensions of said second passageway substantially constant despite pressure changes therein, and b. said tubular heat sink portion is mounted for movement relative to said disk-like body to allow the volume of said fluid circuit to change to accommodate thermally induced expansion and contraction of said liquid metal.

20. The current-controlling assembly of claim 1 in which:

a. said core is effectively fixed to said disk-like body portion, and b. reinforcing structure is provided between said core face portion and said disk-like body in the current-carrying region of said disk-like body for transmitting mechanical force between said disk-like body and said core, thereby providing mechanical back-up for said disk-like body.

21. The current-controlling assembly of claim 20 in which said reinforcing structure comprises projections having edges against which said disk-like body is adapted to bear to receive mechanical back-up.

22. The current-controlling assembly of claim 5 in which:

a. said second passageway extends between said disk-like body and the portion of said heat sink closely adjacent said disk-like body, b. said closely adjacent portion of said heat sink is effectively fixed to said disk-like body, thereby maintaining the dimensions of said second passageway substantially constant despite pressure changes therein, c. said heat sink has another portion that is mounted for movement relative to said disk-like body to allow the volume of said fluid circuit to change to accommodate thermally induced expansion and contraction of said liquid metal.

23. The assembly of claim 22 in which reinforcing structure is provided extending across said second passageway in the current-carrying region of said disk-like body for transmitting mechanical force between disk-like body and said heat sink portion, thereby providing mechanical back-up for said disk-like body.

* * * * *